United States Patent
Chopra (10) Patent No.: US 7,235,421 B2
(45) Date of Patent: Jun. 26, 2007

(54) SYSTEM AND METHOD FOR DEVELOPING PRODUCTION NANO-MATERIAL

(75) Inventor: Nasreen G. Chopra, Belmont, CA (US)

(73) Assignee: Nasreen Chopra, Belmont, CA (US)

( * ) Notice: Subject to any disclaimer, the term of this patent is extended or adjusted under 35 U.S.C. 154(b) by 136 days.

(21) Appl. No.: 10/944,481

(22) Filed: Sep. 16, 2004

(65) Prior Publication Data

US 2005/0090024 A1    Apr. 28, 2005

Related U.S. Application Data

(60) Provisional application No. 60/503,638, filed on Sep. 16, 2003.

(51) Int. Cl.
*H01I 51/40* (2006.01)

(52) U.S. Cl. .................................. 438/99; 257/E21.327

(58) Field of Classification Search .................... 438/5, 438/7, 10–11, 14, 16–17, 18, 22–24, 29, 31, 438/34–36, 128–130, 149, 484, 535
See application file for complete search history.

(56) References Cited

U.S. PATENT DOCUMENTS

| 5,946,930 A | 9/1999 | Anthony |
| 5,965,267 A | 10/1999 | Nolan et al. |
| 6,407,922 B1 | 6/2002 | Eckblad et al. |
| 6,467,951 B1 * | 10/2002 | Ghoshal ........................ 374/45 |
| 6,936,496 B2 * | 8/2005 | Meyer et al. .................. 438/99 |
| 2003/0116503 A1 | 6/2003 | Wang et al. |
| 2003/0117770 A1 | 6/2003 | Montgomery et al. |
| 2005/0164432 A1 * | 7/2005 | Lieber et al. ................ 438/149 |

FOREIGN PATENT DOCUMENTS

| KR | 2003062116 A | 7/2003 |
| WO | WO 02/84757 A1 | 10/2002 |

* cited by examiner

*Primary Examiner*—Walter Lindsay, Jr.
*Assistant Examiner*—Andre' Stevenson
(74) *Attorney, Agent, or Firm*—Townsend and Townsend and Crew LLP (57) ABSTRACT

A method for developing a manufacturing process includes measuring, in a first testing environment, a primary property of a nano-engineered material at one or more positions to provide one or more measurements. The method also includes determining whether the one or more measurements satisfy a first tolerance criterion and taking a further action based on whether the one or more measurements satisfy the first tolerance criterion. Additionally, a method of measuring thermal properties of a nano-engineered material includes irradiating a nano-engineered material with laser radiation, wherein the laser radiation impinges on a first surface of the nano-engineered material at one ore more locations, capturing at least one image of the nano-engineered material, and analyzing the at least one image to characterize the thermal properties of the nano-engineered material.

42 Claims, 7 Drawing Sheets

SYSTEM AND METHOD FOR DEVELOPING PRODUCTION NANO-MATERIAL

CROSS-REFERENCES TO RELATED APPLICATIONS

This application claims the benefit of the following provisional U.S. patent application:

Application No. 60/503,638, filed Sep. 16, 2003, entitled "System for Developing Production Nano-Material."

This application incorporates by reference for all purposes the entire disclosures of the following seven provisional U.S. patent applications:

Application No. 60/503,591, filed Sep. 16, 2003, entitled "Nano-Material for System Thermal Management";

Application No. 60/503,612, filed Sep. 16, 2003, entitled "Oriented Nano-Material for System Thermal Management";

Application No. 60/503,638, filed Sep. 16, 2003, entitled "System for Developing Production Nano-Material";

Application No. 60/503,613, filed Sep. 16, 2003, entitled "Nano-Material Thermal and Electrical Contact System";

Application No. 60/532,244, filed Dec. 23, 2003, entitled "Nanotube Augmentation of Heat Exchange Structure";

Application No. 60/544,709, filed Feb. 13, 2004, entitled "Nano-Material Thermal Management System"; and Application No. 60/560,180, filed Apr. 6, 2004, entitled "Heat Transfer Structure."

The following five regular U.S. patent applications (including this one) are being filed concurrently, and the entire disclosures of the other four are incorporated by reference into this application for all purposes.

Application Ser. No. 10/944,472, filed Sep. 16, 2004, entitled "Nano-Composite Materials for Thermal Management Applications";

application Ser. No. 10/944,466, filed Sep. 16, 2004, entitled "Nanostructure Augmentation of Surfaces for Enhanced Thermal Transfer with Increased Surface Area";

application Ser. No. 10/944,485, filed Sep. 16, 2004, entitled "Nanostructure Augmentation of Surfaces for Enhanced Thermal Transfer with Improved Contact";

application Ser. No. 10/943,893, filed Sep. 16, 2004, entitled "System and Method for Developing Production Nano-Material"; and application Ser. No. 10/943,803, filed Sep. 16, 2004, entitled "Nano-Material Thermal and Electrical Contact System".

BACKGROUND OF THE INVENTION

This invention relates generally to methods of developing manufacturing processes for materials and more specifically to methods of developing manufacturing processes for nano-engineered materials or other articles or materials that include nanostructures.

In recent years, there has been significant scientific interest and research in the area of nanostructures. Some of this interest has been due to the novel electrical, mechanical, thermal, and field emission properties of these nanostructures. In particular, the thermal conductivity of carbon nanotubes has been studied by various research groups. Much of this research has been limited to academic and other non-industrial research environments. Often these research environments have not selected fabrication repeatability and reliability of the manufactured product as important factors in the research program. As nano-materials development transitions from the research to the manufacturing phase, eventually resulting in the production of commercial products, methods and systems for developing manufacturing and production processes for nano-materials become important.

SUMMARY OF THE INVENTION

This invention relates generally to methods of developing manufacturing processes for materials and more specifically to methods of developing manufacturing processes for nano-engineered materials or other articles or materials that include nanostructures.

According to one aspect of the present invention, a method for developing a manufacturing process includes measuring, in a first testing environment, a primary property of a nano-engineered material at one or more positions to provide one or more measurements and determining whether the one or more measurements satisfy a first tolerance criterion. The method also includes taking a further action based on whether the one or more measurements satisfy the first tolerance criterion. In one embodiment, the primary property is a thermal property of the nano-engineered material. In a particular embodiment, the first tolerance criterion is a predetermined range of thermal dissipation values. Moreover, in an additional embodiment, the nano-engineered material comprises a first base layer of a first base material, a second base layer of a second base material, and a film layer including a plurality of nanotubes. The film layer is preferably disposed between and in thermal contact with each of the first and second base layers. In other embodiments, the nano-engineered material consists essentially of nanotubes selected from the group consisting of carbon nanotubes and boron nitride nanotubes.

According to another aspect of the present invention, a method for developing a manufacturing process includes measuring, in a first testing environment, a primary property of a nano-engineered material at a plurality of positions to provide a plurality of measurements and measuring the primary property in a second testing environment. The method also includes determining whether the measurement of the primary property in the first testing environment satisfies a first tolerance criterion and whether the measurement of the primary property in the second testing environment satisfies a second tolerance criterion, and taking a further action based on the results of the determining step. In one embodiment, the invention further includes recording the measurements of the primary property in the first and second testing environments, and measuring a secondary property of the nano-engineered material if either or both of the first and second tolerance criteria are not satisfied.

According to yet another aspect of the present invention, a method of measuring thermal properties of a nano-engineered material includes irradiating a nano-engineered material with laser radiation, wherein the laser radiation impinges on a first surface of the nano-engineered material at one ore more locations. The method further includes capturing at least one image of the nano-engineered material and analyzing the at least one image to characterize the thermal properties of the nano-engineered material. In a particular embodiment, the at least one image is a sequence of images.

The remaining portions of the specification together with the accompanying drawings will provide a better understanding of the nature and advantages of the present invention.

DESCRIPTION OF SPECIFIC EMBODIMENTS

This invention relates generally to methods of developing manufacturing processes for materials and more specifically to methods of developing manufacturing processes for nano-engineered materials or other articles or materials that include nanostructures.

The term "nanostructure," or nanoscale structure is used herein to refer to a structure with at least one dimension that is on the order of nanometers (e.g., from about 1 to 100 nm); one or more of the other dimensions may be larger and may be microscopic (from about 10 nm to a few hundred micrometers) or macroscopic (larger than a few hundred micrometers). Specific embodiments use nanotubes (e.g., carbon or boron nitride nanotubes). However, other embodiments can use nanostructures such as nanorods, nanofibers, nanocrystals, fullerenes, and other nanoscale structures such as diamond dust made from crystalline or CVD diamond flecks, as well as chains of nanocrystals or fullerenes.

The term "nano-engineered material" is used herein to refer a material that includes (or possibly consists essentially of) nanostructures. Nano-engineered materials include, for example, mats of nanostructures, groupings of nanostructures deposited on a patterned layer using deposition techniques, and nano-composite materials.

The term "nano-composite material" is used herein to refer to a composite material comprising a base, or matrix, material into which are incorporated nanostructures. In some embodiments, the nanostructures are dispersed into the base material. In other embodiments, the nano-composite material has a layered structure in which some layers are made of a base material while other layers are made entirely or predominantly of nanostructures. Nano-composite materials may incorporate one or more different kinds of nanostructures, with the nanostructures being selected for high thermal conductivity or other desirable thermal properties in some applications. Additional details regarding nano-composite materials are found in the above-referenced co-pending application Ser. No. 10/944,472, Nanotubes can be synthesized in various ways including arc-discharge, laser ablation, or chemical vapor deposition (CVD) processes and the like. Particular synthesis techniques are not critical to the present invention. As is known in the art, many of these techniques involve depositing a catalyst material onto a substrate and growing a cluster or bundle of nanotubes where catalyst material is present. Thus, while the present description refers to nanotubes, it is to be understood that clusters or bundles of nanotubes may be used to realize aspects of the invention. The invention also applies to materials using other nanostructures.

A nano-composite material can be produced, e.g., by synthesizing nanotubes first then mixing or otherwise distributing the nanotubes into the base material with a desired uniformity. In some embodiments, bundles of nanotubes may be grown and dispersed as bundles; in other embodiments, individual nanotubes are dispersed. Depending on the base material and the diameter of the nanotubes, in some instances, some or all of the nanotubes may be completely or partially filled by atoms or molecules of the base material.

In some embodiments, the nanotubes or other nanostructures are dispersed substantially uniformly throughout the base material. In other embodiments, the concentration of nanotubes or other nanostructures may vary from one region to another within the material. Where the nanostructures have higher thermal conductivity than the base material, the thermal conductivity of the nano-composite material will tend to vary with the concentration of nanotubes. Thus, thermal conductivity gradients can be established, and by selectively controlling the concentration of nanotubes in different regions of the material, thermal paths can be created, where the term "thermal path" refers to a preferred direction of heat conduction through a region.

Generally, it is difficult to control the fabrication or synthesis process for nano-engineered materials with enough precision to reliably and reproducibly produce nanostructures with predetermined physical characteristics on the molecular level. Moreover, due to the extremely small size of many nano-engineered materials, characterization techniques that provide information regarding the physical characteristics of the nanostructures are typically expensive, time consuming, and not always readily available. However, for many industrial applications, the "bulk" properties of the nano-engineered material, such as thermal dissipation characteristics and electron emission characteristics, are of more interest.

Thus, for some applications, measurements of bulk properties of the nano-engineered material are a preferred alternative to expensive and difficult nanometer scale physical characterization techniques. Accordingly, the present invention provides a method for developing a manufacturing process for nano-engineered materials that utilizes measurements of the bulk properties of a nano-engineered material and comparison of these measurements with predetermined tolerance criteria in the process development cycle. The measurements of the bulk properties are utilized in a feedback loop that may result in modification of the fabrication parameters in an iterative manner. As will be evident to one of skill in the art, modification of the fabrication parameters will typically result in modification of the nano-engineered material at the nanometer scale level, thereby producing changes in the bulk properties of the material.

The use of nano-engineered materials in many commercial applications will benefit from the optimization of the nanostructure synthesis process. For example, commercial applications which require large areas of nano-engineered materials (compared to the size of the nanostructures) will often benefit from high levels of uniformity (or close adherence to predetermined variations from uniformity in accordance with defined design criteria). Additionally, improvements in the reliability of the manufactured nanostructures will be advantageous for many commercial and industrial applications. Accordingly, embodiments of the present invention provide techniques for developing a manufacturing process for nano-engineered materials suitable for commercial applications of the nano-engineered materials. In addition to improvements in the uniformity and reliability of the nano-engineered materials themselves, the present invention provides a method for optimizing the manufacturing process, resulting in increased repeatability for the synthesis process and increased batch-to-batch quality control.

Figure 1A:
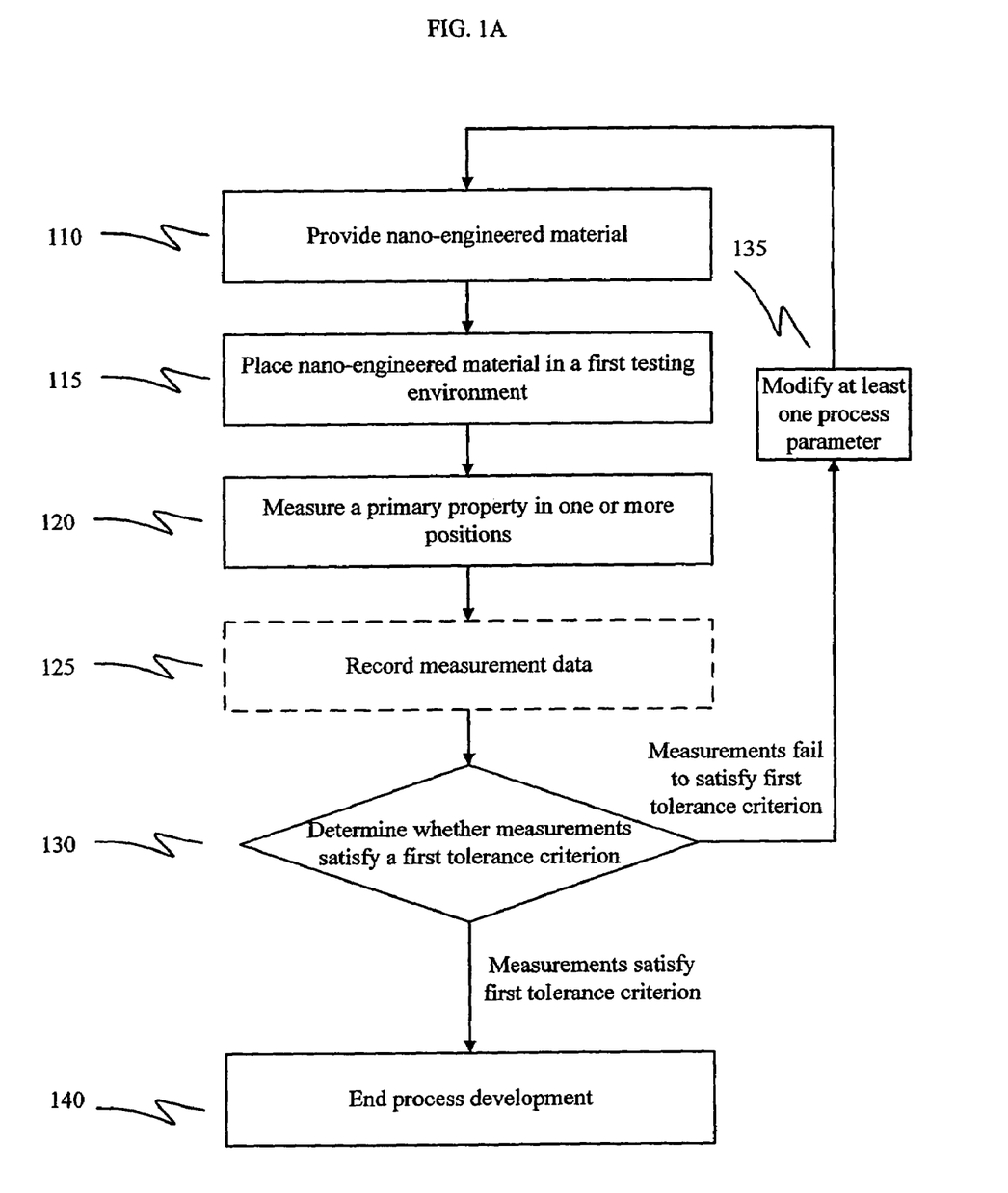
FIG. 1A is a flowchart schematically illustrating a method of developing a manufacturing process according to an embodiment of the present invention.

FIG. 1A is a flowchart schematically illustrating a method of developing a manufacturing process according to one embodiment of the present invention. As illustrated in FIG. 1A, the method is initiated by providing a nano-engineered material (step 110). In some embodiments, this includes fabricating a nano-engineered material in accordance with predetermined fabrication parameters. As discussed, above, several alternative techniques can be used during this synthesis step, including arc-discharge, laser ablation, or chemical vapor deposition (CVD) processes and the like. Particular synthesis techniques are not critical to the present invention. Merely by way of example, several of the predetermined fabrication parameters for a CVD process are deposition chamber temperature, deposition chamber pressure, and process gas flow rates. As will be evident to one of skill in the art, these fabrication parameters are typically functions of time.

The nano-engineered material provided or synthesized in step 110 will generally result in a macroscopic sample suitable for initial testing and eventual use in commercial applications. Applications of various nano-engineered materials include integrated circuit heat sinks made of conventional materials and coated with nanotubes, heat sinks with nanofins and reduced form factors, integrated circuit packages with integral nanofins, and patterned arrays with nanotubes as field emitters. These examples, along with others, are disclosed in the above-referenced co-pending application Ser. No. 10/944,466, application Ser. No. 10/944,485, The material produced in step 110 might be suitable for use in such applications or might already be shaped into these or other articles.

Figure 2:
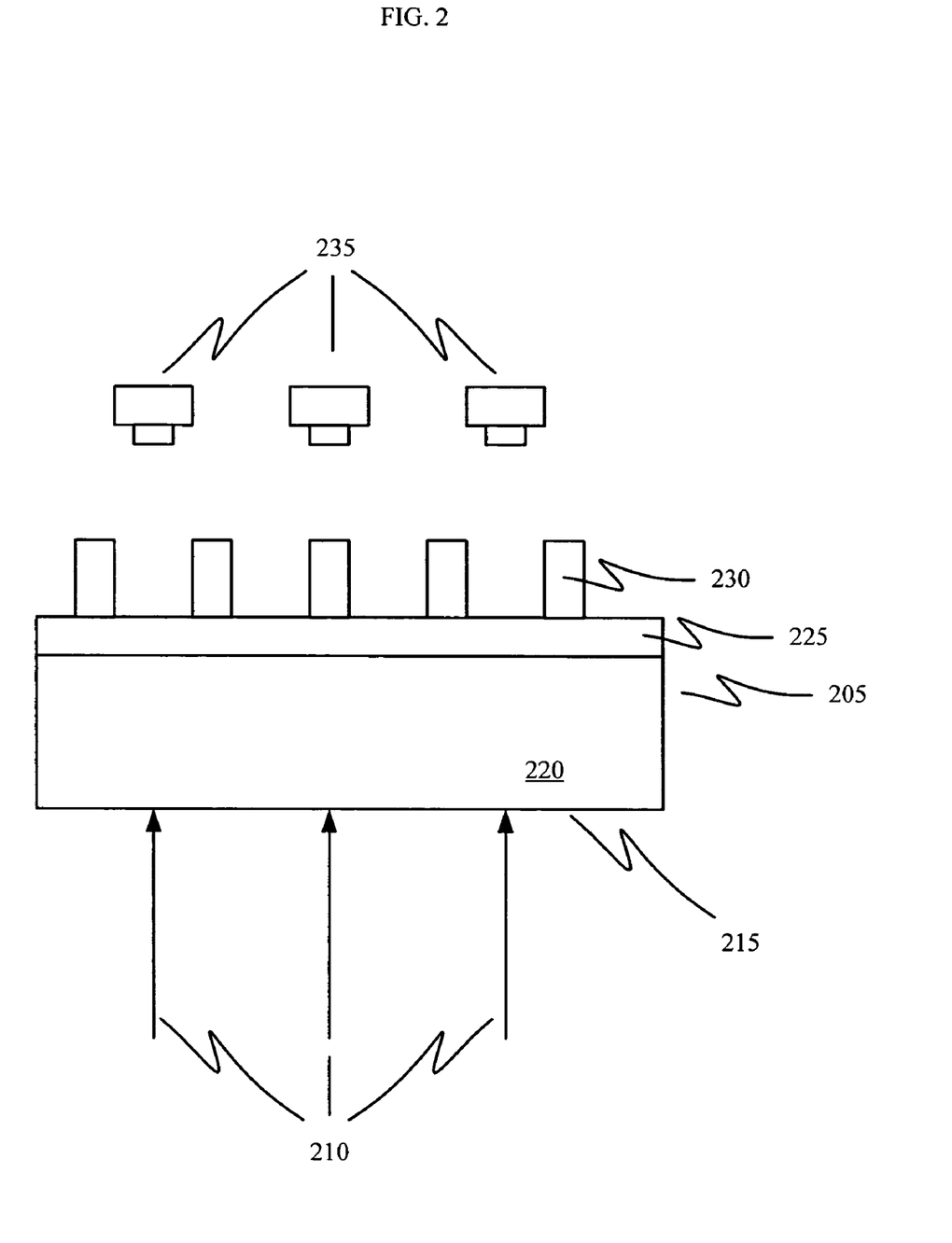
FIG. 2 is a schematic diagram of a thermal dissipation measurement system according to an embodiment of the present invention.

Next, as illustrated in step 115 of FIG. 1A, the nano-engineered material is placed in a first testing environment useful for measuring a primary property of the material. The term "placed" does not require motion of the nano-engineered material, as the nano-engineered material may be fabricated in the test setup, not requiring movement of the material from the fabrication location to the testing location. In a particular embodiment, the first testing environment is a thermal dissipation measurement system as schematically illustrated in FIG. 2, useful for measuring thermal dissipation characteristics. As illustrated in FIG. 2, laser pulses 210 are incident on a lower surface 215 of the nano-engineered material 205. The wavelength of the laser radiation is selected to provide for absorption of the laser radiation by the lower surface 215 of the nano-engineered material. Merely by way of example, laser radiation in the ultraviolet, visible, or infrared spectrum may be utilized depending on the spectral absorption coefficients of the material used to fabricate the nano-engineered material.

The laser pulses may be incident on the material in a sequential or simultaneous manner, as desired by the operator. Of course, other radiation sources, including electron beams, could be utilized in place of the laser beams to provide a controllable source of incident radiation. In a specific embodiment, a single laser source is used with a moldable mirror to direct the laser pulses to predetermined locations on the sample. In this specific embodiment, laser pulses are directed to impinge on the material with a lateral spacing (x-axis) of about 1 cm and a longitudinal spacing (y-axis) of about 1 cm. Generally, the density of laser pulses is approximately equal to 1 pulse per square centimeter. The spacing between laser pulses can be larger for larger samples in a manufacturing environment or for optimizing manufacturing depending on the application. Of course, the distribution of the laser pulses need not be uniform. In this specific embodiment, the material is translated along the x and y-axes, providing for laser pulses impinging on the material in a two-dimensional pattern. In another embodiment, the laser source is translated. In alternative embodiments, multiple laser sources or optical beamsplitters are utilized to create simultaneous laser pulses incident on the material in either a linear arrangement of pulses or a two-dimensional arrangement of pulses.

In a particular embodiment, the wavelength and intensity of the laser pulses 210 is predetermined and matched to the absorption coefficient of the nano-engineered material to define a desired thermal profile. The intensity of the laser pulse can be increased by increasing the laser power or decreasing the spot size of the laser at the surface of the nano-engineered material. In this particular embodiment, the radiation will be absorbed in a small region surrounding the point where the pulse impinges on the lower surface of the nano-engineered material. In one embodiment, the laser spot size at the surface of the nano-engineered material ranges from 0.1 µm–100 µm. Absorption of the laser radiation will create a thermal gradient between the lower and upper surfaces of the material and result in dissipation of the absorbed energy through the upper surface of the material. Operation of the laser pulses in a simultaneous manner provides the operator with a means to establish initial thermal gradients that vary as a function of position. Merely by way of example, simultaneous laser pulses incident near the periphery of the material will establish a different thermal profile than a single laser pulse incident near the center of the material.

In the embodiment of the nano-engineered material 205 illustrated (not to scale) in FIG. 2, the material includes a substrate 220, a catalyst layer 225, and a plurality of nanotubes 230. Although a catalyst layer is included in the embodiment illustrated in FIG. 2, growth of nanotubes does not always require a catalyst and layer 225 is not required. In some embodiments. Heat dissipated through the upper surface of the material, including through the nanotubes 230, is detected by infrared cameras 235 positioned above the nano-engineered material. The spectral detectivity of the infrared cameras is selected to overlap the spectral signature of the thermal profiles present in the material. The lateral spacing between the cameras enables the operator to perform measurements of the uniformity of heat dissipation from the nano-engineered material using the measurement system illustrated in FIG. 2. Additionally, as discussed above, translation of the nano-engineered material with respect to the laser pulses and/or measurement cameras can be performed to verify uniformity data and characterize edge effects, among other properties. In a particular embodiment, the material is mounted on a moldable gantry that is controllable in at least two dimensions. During testing, the gantry translates the material with respect to the laser pulses and/or measurement cameras as the data on the primary property is collected.

In alternative embodiments, the testing environment comprises a single test setup with varying test conditions. For example, in a specific embodiment utilizing the test setup illustrated in FIG. 2, the intensity of the laser pulses is set at a first value during a first test run on a nano-engineered material and increased to a second value during a second test run using the same test setup and same nano-engineered material. In an alternative specific embodiment, the gantry translates by a first amount during a first test run and by a smaller second amount during a second test run, collecting data with finer granularity in the second test run.

In the embodiment illustrated in FIG. 2, the first testing environment enabled the operator to make measurements of the primary property of thermal dissipation, but this is not required by the present invention. In alternative embodiments, other characterization systems can be employed to obtain measurement data related to other material properties. For example, a field emission test setup can be utilized to characterize the electron emission properties of the nano-engineered material as a primary property.

Figure 3:
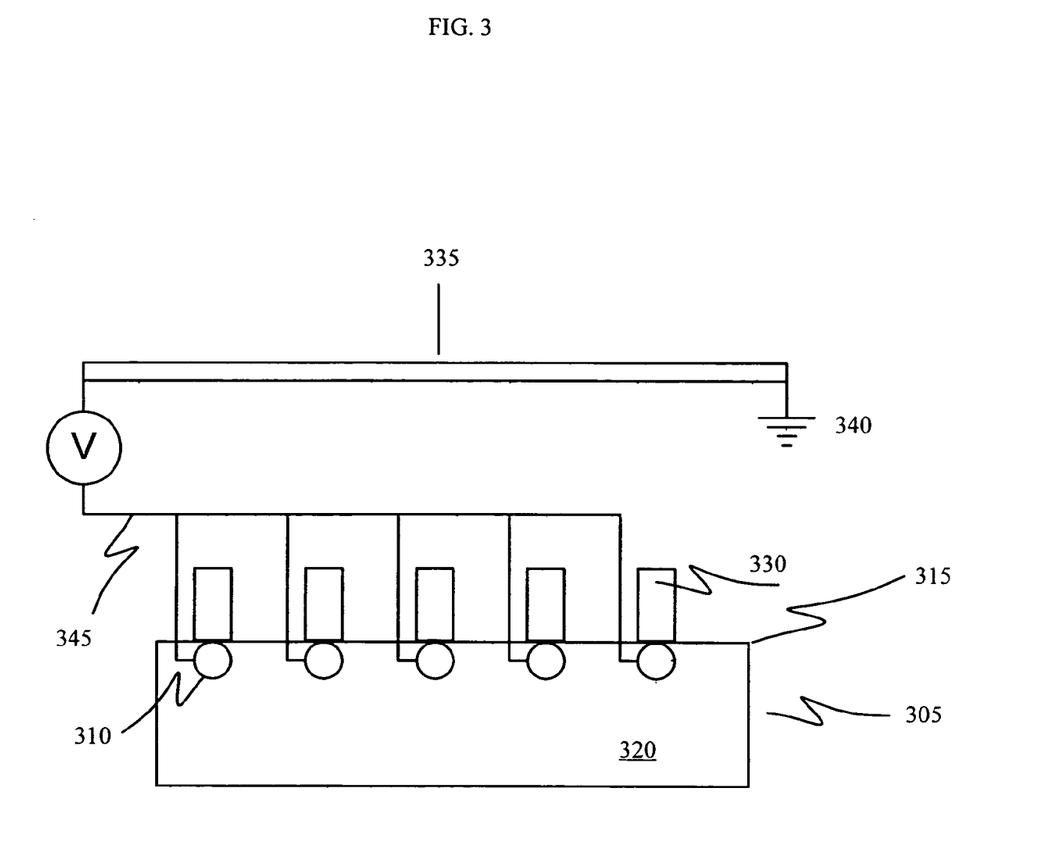
FIG. 3 is a schematic diagram of a field emission test system according to an embodiment of the present invention.

FIG. 3 is a schematic diagram of a field emission test system according to an embodiment of the present invention. As illustrated in FIG. 3, the nano-engineered material 305 includes a substrate 320 and a plurality of nanotubes 330 (which may be realized as nanotube bundles). In addition to the embodiment illustrated in FIG. 3, the nano-engineered material can be fabricated in other ways in other embodiments. For example, nanotubes are formed by an arc-discharge process in one embodiment and applied to a substrate in clusters. Electrical contact points 310 are formed on the upper surface 315 of the nano-engineered material 305. These electrical contact points may be on a common bus, may be electrically isolated from each other, or may share a common bus with a subset of the electrical contact points. Moreover, particular nanotube groupings may be electrically connected to particular electrical contact points, which are electrically isolated from other electrical contact points. Electrical contact is made to contact points 310 by way of an electrical lead 345, which is connected through a voltage source to a ground plane 335, in electrical contact with ground 340. In some embodiments, electrons impinge on a phosphor that glows as a result of the electron impingement.

Applying a bias to the material at one or more of the electrical contacts 310, the electron emission properties of the nano-engineered material are characterized in this embodiment. In a particular embodiment, the contact points 310 are contacted with the electrical lead 345 in a sequential manner. Thus, the lateral distribution of the contact points 310 and the sequential testing methodology provide a means for characterizing the electron emission properties of the nano-engineered material as a function of position. In the embodiment illustrated in FIG. 3, the first testing environment enables the operator to make measurements of electron emission uniformity as the primary property, but this is not required by the present invention. Alternative embodiments utilize electron beam radiation to provide an electron source for characterization of the electron emission properties of the material.

Alternative embodiments of the present invention utilize a first testing environment to obtain characterization information about other primary properties of the nano-engineered material. In the embodiments discussed above, the primary properties have been bulk properties, that is, properties characteristic of the macroscopic sample. Additional embodiments utilize measurements of additional bulk primary properties in the feedback loop that adjusts the fabrication parameters and performs fabrication runs in an iterative manner.

Returning to FIG. 1A, in step 120, a primary property of the nano-engineered material is measured in multiple positions to provide multiple measurements. Methods and systems for performing these have been discussed in relation to FIGS. 2 and 3. In particular embodiments in accordance with the present invention, it is preferable to maintain a database of process results. Accordingly, the measurement data collected in step 120 is recorded in optional step 125. Measurement data is collected in a computer database in some embodiments and utilized to analyze the performance metrics of a particular nano-engineered material. In some embodiments, the measurement data collected in step 120 is combined with data collected during the fabrication process of step 110 and analyzed to improve the uniformity of individual samples, as well as repeatability of the manufacturing processes. In this particular embodiment, the measurement data collected in both steps 1110 and 120 is utilized to improve process uniformity, not only for individual samples, but on a batch-to-batch basis, thereby improving the reliability and repeatability of the manufacturing process.

In step 130, the measurements are compared to a first tolerance criterion to determine whether the measurements satisfy the first tolerance criterion. For example, in the embodiment illustrated in FIG. 2, the primary property of thermal dissipation is measured in the testing environment illustrated in the figure and compared to a first tolerance criterion of a desired thermal dissipation. As discussed in relation to FIG. 2, the spatial uniformity (or adherence to a designed non-uniform profile) of the thermal dissipation as well as the absolute values measured for thermal dissipation can be compared to desired values. As discussed in relation to FIG. 3, the electron emission profile, as well as the absolute values measured for electron emission density can be compared to desired values. Alternative measurements and tolerance criterion will be apparent to one of skill in the art.

Depending on the result obtained in step 130, the method provides two alternatives. If the measurements fail to satisfy the first tolerance criterion, a further action is taken in step 135. On the other hand, if the measurements satisfy the first tolerance criterion, the process development is terminated in step 140. In one embodiment, the further action can be modifying at least one process parameter, after which the fabrication/synthesis step is repeated, resulting in the production of a modified nano-engineered material in step 110. Testing of the modified material proceeds in step 115 as previously described.

In another embodiment, the further action is recording the measurement data for storage and future use in step 125. In situations where the manufacturing of the nano-engineered material and the testing of the material are performed by different personnel or at different facilities, measurement data collected in step 120 can be provided to the manufacturing personnel by the testing personnel. Thus, a method is provided for developing a manufacturing process for optimizing the production of nano-engineered materials suitable for commercialization.

In some embodiments, a primary property is measured for a given sample of nano-engineered material, and a measurement set of one or more measurement values is provided.

While it is desirable in some instances to take corrective action based on the measurement set from a single sample of the nano-engineered material, other embodiments take corrective action only after measurement sets have been generated for a plurality of samples of nano-engineered materials made using the same parameters. For example, corrective action might be taken when systematic, albeit small, departures from the norm are detected, even if a single departure at that level would be tolerable. Conversely, a single instance of a nano-engineered material's primary property falling significantly outside the norm might be sufficient to cause corrective action.

Figure 1B:
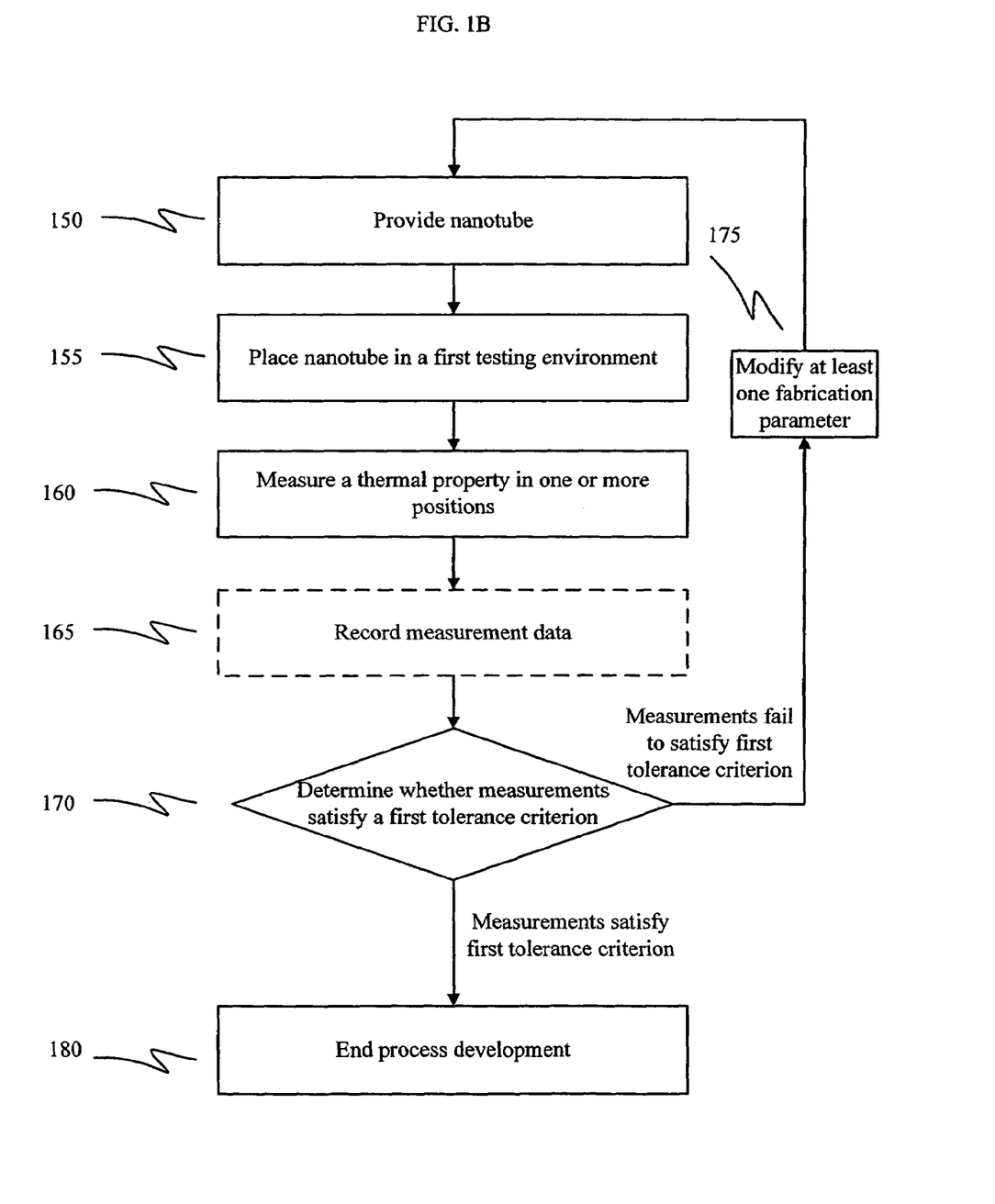
FIG. 1B is a flowchart schematically illustrating a method of developing a manufacturing process according to another embodiment of the present invention.

FIG. 1B is a flowchart schematically illustrating a method of developing a manufacturing process for nanotubes according to another embodiment of the present invention. As illustrated in FIG. 1B, in step 150, at least one nanotube is provided. In step 155, the nanotube is placed in a first testing environment. A thermal property of the nanotube is measured in one or more positions in step 160. Optional recording of the measurement data is provided in step 165. In step 170, a determination is made of whether the measurement data satisfies a first tolerance criterion. If the measurements satisfy the first tolerance criterion, the development of the manufacturing process is terminated. If the measurements do not satisfy the first tolerance criterion, at least one fabrication parameter is modified in step 175 prior to the fabrication of additional nanotubes.

Figure 4:
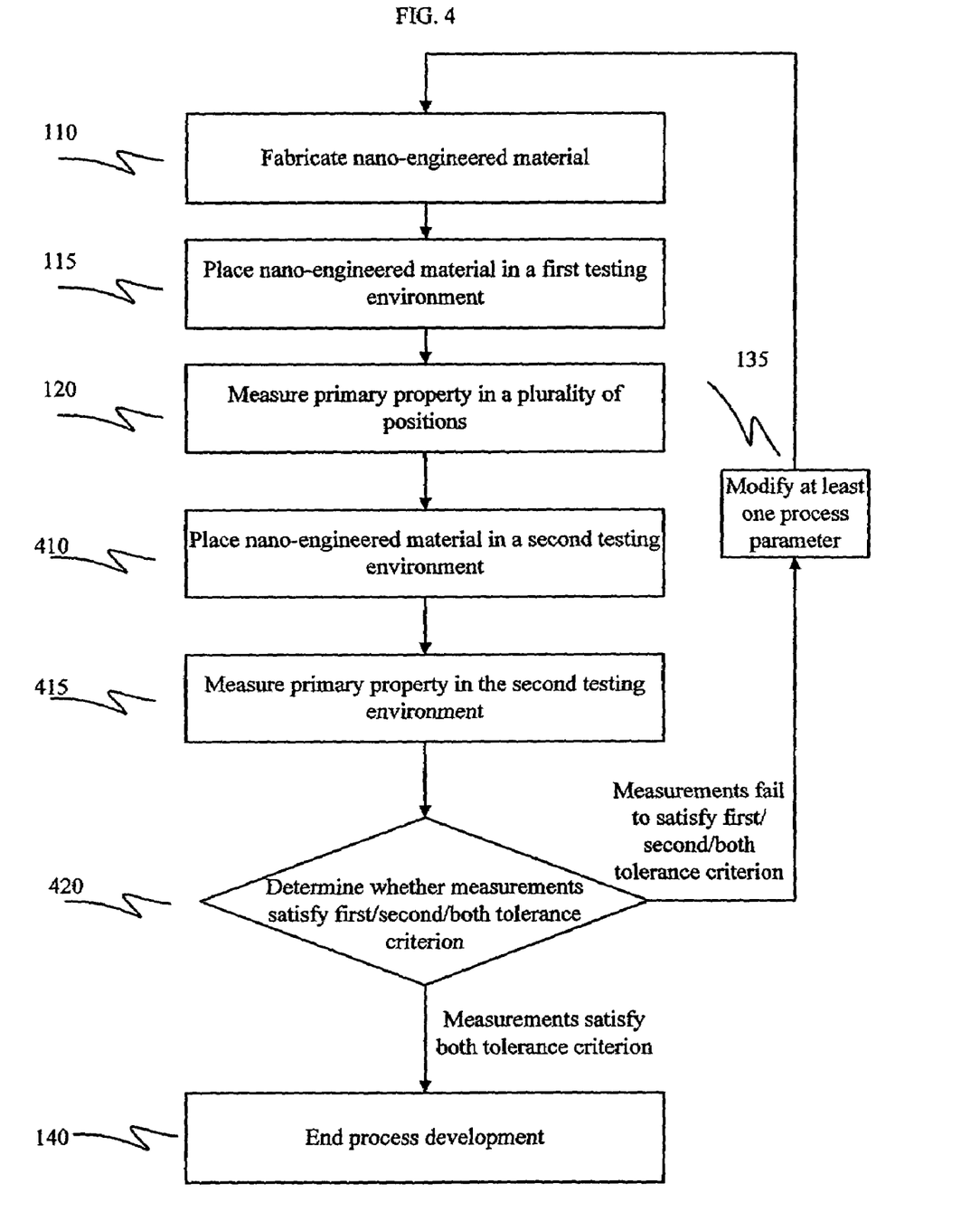
FIG. 4 is a flowchart schematically illustrating a method of developing a manufacturing process according to an alternative embodiment of the present invention.

As illustrated in FIG. 4, an alternative method of developing a manufacturing process is initiated by fabricating a nano-engineered material in accordance with predetermined fabrication parameters (step 110). As discussed, above, several alternative techniques can be used during this synthesis step, including arc-discharge, laser ablation, or chemical vapor deposition (CVD) processes and the like. Particular synthesis techniques are not critical to the present invention. Merely by way of example, several of the predetermined fabrication parameters for a CVD process are deposition chamber temperature, deposition chamber pressure, and process gas flow rates. As will be evident to one of skill in the art, these fabrication parameters are typically functions of time.

Next, as illustrated in step 115 of FIG. 4, the nano-engineered material is placed in a first testing environment useful for measuring a primary property of the material. In this embodiment, as illustrated in step 120, the first testing environment is utilized to measure a primary property of the material in a plurality of positions. As discussed above, the primary property in one embodiment is thermal dissipation and in another embodiment is electron emission density. Test environments as illustrated in FIGS. 2 and 3 are utilized in some embodiments according to the present invention, but this is not required by the invention.

In step 410, the nano-engineered material is placed in a second testing environment. In this context, "placing" the material does not require actual movement, but may entail running separate tests. In step 415, the primary property is measured in the second testing environment. In a particular embodiment, the second testing environment consists of mounting an integrated circuit chip on the nano-engineered material, placing the integrated circuit chip in an operating condition, and measuring the thermal profile resulting from the heat generated during operation of the integrated circuit chip. In an alternative embodiment, an integrated circuit chip that creates a known thermal load during operation can be coupled to the nano-engineered material and the thermal dissipation of the nano-engineered material is measured. Additional testing environments and measurements will be apparent to one of skill in the art.

In step 420, a determination is made of whether the measurements made in the first testing environment satisfy the first tolerance criterion, whether the measurements made in the second testing environment satisfy a second tolerance criterion, whether both the measurements made in the first and second environment satisfy their respective tolerance criteria, or whether neither the measurements made in the first or second testing environment satisfy their respective tolerance criteria. Merely by way of example, a second tolerance criterion of a desired thermal dissipation characteristic is appropriate for a second testing environment in which the thermal dissipation of the nano-engineered material is measured utilizing an integrated circuit chip that generates a known thermal load. Alternatively, the second testing environment may be a finer or more stringent set of the same basic tests.

Depending on the result obtained in step 420, the method provides two alternatives. If the measurements in either the first or second testing environments, or both, fail to satisfy their respective tolerance criterion, at least one process parameter is modified in step 135 and the fabrication/synthesis step is repeated, resulting in the production of a modified nano-engineered material in step 110. Testing of the modified material proceeds in step 115 as previously described. On the other hand, if both measurements satisfy their respective tolerance criterion, the process development is terminated in step 140. Thus, a method is provided for developing a manufacturing process for optimizing the production of nano-engineered materials suitable for commercialization.

Figure 5:
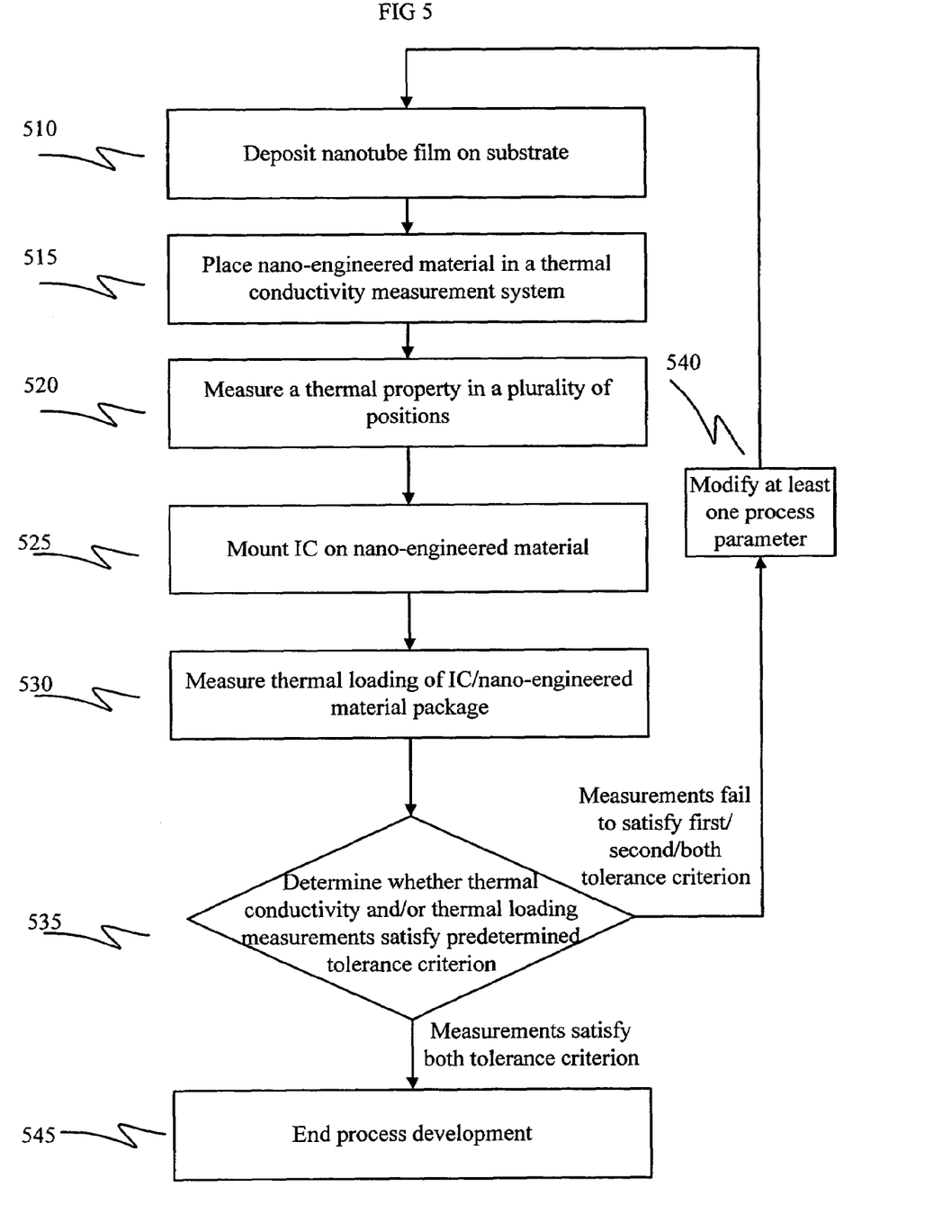
FIG. 5 is a flowchart schematically illustrating a method of developing a manufacturing process according to a specific embodiment of the present invention.

FIG. 5 is a flowchart schematically illustrating a method of developing a manufacturing process for nanotube film materials according to a specific embodiment of the present invention. As illustrated in FIG. 5, in step 510, a nanotube film is deposited on a substrate. In one embodiment, the nanotube film is a densely packed film of nanotubes. In an alternative embodiment, the nanotube film is a sparsely packed film of nanotubes with a second material embedded within the spaces between the sparsely packed nanotubes. In yet another alternative embodiment, the nanotube film is a loosely packed film of nanotubes with a third material embedded inside the nanotubes; the second material may or may not be embedded within the spaces between the loosely packed nanotubes.

After fabrication of the nanotube film on the substrate, the material is placed in a thermal dissipation measurement system in step 515. In one embodiment, the thermal dissipation measurement system is the one illustrated in FIG. 2. In alternative embodiments, the thermal dissipation measurement system provides additional sources of thermal energy and additional detectors as appropriate for the testing methodology. In the embodiment illustrated in FIG. 5, the thermal dissipation of the material is measured in a plurality of positions in step 520.

In step 525, an integrated circuit (IC) is mounted on the material fabricated in step 510. In step 530, the thermal loading of the IC/nano-engineered material package is measured. The measurements obtained for the thermal dissipation and thermal loading in steps 520 and 530 respectively, are compared to predetermined tolerance criterion in step 535. If either or both of the measurements fail to satisfy their respective criteria, at least one process step is modified in step 540 and a modified nanotube film is deposited on a substrate in the subsequent iteration of step 510. If, on the other hand, both measurements of thermal dissipation and thermal loading satisfy their respective criteria, the process development is ended at step 545.

In some embodiments according to the present invention, measurement data collected in the first testing environment and the second testing environment is recorded and stored for future use. Comparisons between initial and subsequent measurements during different stages of the iterative fabrication process illustrated in FIGS. 1, 4, and 5 are used in some embodiments to analyze batch-to-batch uniformity and repeatability. Batch-to-batch quality control processes utilize measurements from different stages of the iterative fabrication process in optimizing the batch-to-batch quality control.

Figure 6:
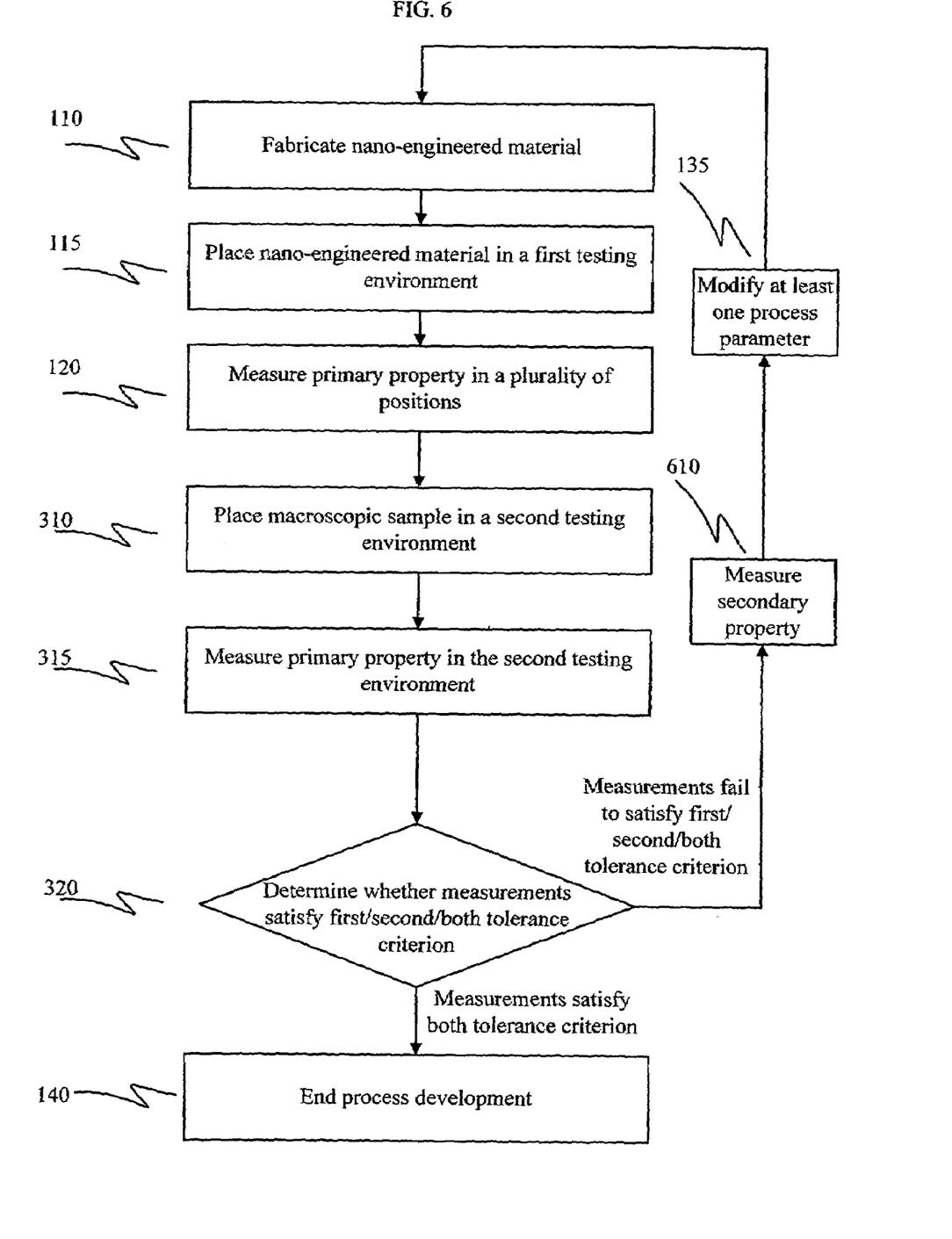
FIG. 6 is a flowchart schematically illustrating a method of developing a manufacturing process according to an alternative specific embodiment of the present invention.

As illustrated in FIG. 6, yet another alternative method of developing a manufacturing process is initiated by fabricating a nano-engineered material in accordance with predetermined fabrication parameters. (Step 110). As discussed, above, several alternative techniques can be used during this synthesis step, including arc-discharge, laser ablation, or chemical vapor deposition (CVD) processes and the like. Particular synthesis techniques are not critical to the present invention. Merely by way of example, several of the predetermined fabrication parameters for a CVD process are deposition chamber temperature, deposition chamber pressure, and process gas flow rates. As will be evident to one of skill in the art, these fabrication parameters are typically functions of time.

Next, as illustrated in step 115 of FIG. 6, the nano-engineered material is placed in a first testing environment useful for measuring a primary property of the material. In this embodiment, as illustrated in step 120, the first testing environment is utilized to measure a primary property of the material in a plurality of position. As discussed above, the primary property in one embodiment is thermal dissipation and in another embodiment is electron emission density. Test environments as illustrated in FIGS. 2 and 3 are utilized in some embodiments according to the present invention, but this is not required by the invention.

In step 310, the nano-engineered material is placed in a second testing environment. In step 315, the primary property is measured in the second testing environment. In a particular embodiment, the second testing environment consists of mounting an integrated circuit chip on the nano-engineered material, operating the integrated circuit chip, and measuring the thermal profile resulting from the heat generated during operation of the integrated circuit chip. In an alternative embodiment, an integrated circuit chip that creates a known thermal load during operation can be coupled to the nano-engineered material and the thermal dissipation of the nano-engineered material is measured. Additional testing environments and measurements will be apparent to one of skill in the art.

In step 320, a determination is made of whether the measurements made in the first testing environment satisfy the first tolerance criterion, whether the measurements made in the second testing environment satisfy a second tolerance criterion, whether both the measurements made in the first and second environment satisfy their respective tolerance criteria, or whether neither the measurements made in the first or second testing environment satisfy their respective tolerance criteria. Merely by way of example, a second tolerance criterion of a desired thermal dissipation is appropriate for a second testing environment in which the thermal dissipation of the nano-engineered material is measured utilizing an integrated circuit chip that generates a known thermal load.

Depending on the result obtained in step 320, the method provides two alternatives. If the measurements in either the first or second testing environments, or both, fail to satisfy their respective tolerance criterion, a measurement is made of a secondary property in step 610. For example, a scanning electron microscope (SEM) image may be obtained of the nano-engineered structural components. An SEM image will typically provide information regarding the orientation of nanotubes, the size of the nanotubes (both lateral and height dimensions), and the uniformity with which nanotubes are distributed on the surface of the nano-engineered material. In other embodiments, measurement of the thickness of the nanotube layer is made. The thickness of this layer and, particularly, the uniformity of the thickness, which both relate to nanotube length, among other factors, is a useful diagnostic to determine the homogeneity of the nanotube growth.

The secondary property in one embodiment is measured with an SEM, but this is not required by the present invention. Other testing options that provide data on a secondary property of the nano-engineered structural components are provided by alternative embodiments. For example, images from a transmission electron microscope or an atomic force microscope are collected and analyzed in alternative embodiments. Moreover, measurements made of the secondary property may be performed in some embodiments even though the measurements of the primary property satisfy both the first and second tolerance criterion. For example, in one embodiment, measurements are made of a secondary property when a third tolerance criterion, such as a threshold limit, is reached by either of the measurements of the primary property. In this embodiment, drifting of the process parameters within predetermined, subcritical limits can be detected and corrections made prior to the process drifting outside preferable process parameters. Furthermore, step 610 may be repeated multiple times in some embodiments prior to proceeding to step 135. Additional measurements of tertiary or other properties may also be collected prior to proceeding to step 135 or directly to step 110, bypassing step 135.

Next, at least one process parameter is modified in step 135 and the fabrication/synthesis step is repeated, resulting in the production of a modified nano-engineered material in step 110. Testing of the modified material proceeds in step 115 as previously described. On the other hand, if both measurements satisfy their respective tolerance criterion, the process development is terminated in step 140. Thus, a method is provided for developing a manufacturing process for optimizing the production of nano-engineered materials suitable for commercialization.

Thus, although the invention has been described with respect to specific embodiments, it will be appreciated that the invention is intended to cover all modifications and equivalents within the scope of the following claims.

What is claimed is:

1. A method for developing a manufacturing process, comprising:
   measuring, in a first testing environment, a primary property of a nano-engineered material at a plurality of positions to provide a plurality of measurements;
   determining whether the plurality of measurements satisfy a first tolerance criterion, wherein the first tolerance criterion is satisfied if the standard deviation of the plurality of measurements is less than 20% of the mean of the plurality of measurements; and
   taking a further action based on whether the plurality of measurements satisfy the first tolerance criterion.

2. The method of claim 1, wherein the primary property is a thermal property of the nano-engineered material.

3. The method of claim 2, wherein the first tolerance criterion is a predetermined range of thermal dissipation values.

4. The method of claim 1, wherein the nano-engineered material comprises:
a first base layer of a first base material;
a second base layer of a second base material; and
a film layer including a plurality of nanotubes, the film layer being disposed between and in thermal contact with each of the first and second base layers.

5. The method of claim 1, wherein the nano-engineered material consists essentially of nanostructures.

6. The method of claim 5, wherein the nanostructures are nanotubes selected from the group consisting of a carbon nanotube and a boron nitride nanotube.

7. The method of claim 1, wherein the primary property is the electrical conductivity of the nano-engineered material.

8. The method of claim 1, wherein the first tolerance criterion is based on an average of the plurality of measurements.

9. The method of claim 1, wherein the first tolerance criterion is based on a standard deviation of the plurality of measurements.

10. The method of claim 1, wherein the farther action is adjusting at least one fabrication parameter and fabricating a modified nano-engineered material.

11. A method of measuring thermal properties of a nano-engineered material, comprising:
irradiating a nano-engineered material with laser radiation, wherein the laser radiation impinges on a first surface of the nano-engineered material at a plurality of locations, the plurality of locations having a location density of about 0.01–1 locations per square centimeter;
capturing at least one image of the nano-engineered material; and
analyzing the at least one image to characterize the thermal properties of the nano-engineered material.

12. The method of claim 11 wherein the at least one image is a sequence of images.

13. The method of claim 11, wherein the laser radiation is ultraviolet radiation.

14. The method of claim 11, wherein the irradiating step comprises generating laser pulses in a sequential manner utilizing at least one laser source and optical beam splitters.

15. The method of claim 11, wherein the irradiating step comprises generating laser pulses in a simultaneous manner utilizing one or more laser sources.

16. The method of claim 11, wherein the laser spot size at the first surface is less than 100 µm.

17. The method of claim 11, wherein the at least one image of the nano-engineered material is captured from a second surface of the nano-engineered material.

18. The method of claim 17, wherein the at least one image is captured using an infrared camera.

19. The method of claim 11, wherein the irradiating step comprises translation of the nano-engineered material with respect to a laser source as a function of time.

20. The method of claim 11, wherein the irradiating step comprises translation of a laser source with respect to the nano-engineered material as a function of time.

21. The method of claim 20, wherein translation of the laser source produces a two-dimensional raster scan of locations on the nano-engineered material.

22. The method of claim 20, wherein translation of the laser source produces a one-dimensional line scan of locations on the nano-engineered material.

23. A method of measuring thermal properties of a nano-engineered material, comprising:
irradiating a nano-engineered material with laser radiation, wherein the laser radiation impinges on a first surface of the nano-engineered material at one or more locations, wherein a laser spot size at the first surface is less than 100 µm;
capturing at least one image of the nano-engineered material; and
analyzing the at least one image to characterize the thermal properties of the nano-engineered material.

24. The method of claim 23, wherein the at least one image is a sequence of images.

25. The method of claim 23, wherein the laser radiation is ultraviolet radiation.

26. The method of claim 23, wherein the irradiating step comprises generating laser pulses in a sequential manner utilizing at least one laser source and optical beam splitters.

27. The method of claim 23, wherein the irradiating step comprises generating laser pulses in a simultaneous manner utilizing one or more laser sources.

28. The method of claim 23, wherein the at least one image of the nano-engineered material is captured from a second surface of the nano-engineered material.

29. The method of claim 28, wherein the at least one image is captured using an infrared camera.

30. The method of claim 23, wherein the irradiating step comprises translation of the nano-engineered material with respect to a laser source as a function of time.

31. The method of claim 23, wherein the irradiating step comprises translation of a laser source with respect to the nano-engineered material as a function of time.

32. The method of claim 31, wherein translation of the laser source produces a two-dimensional raster scan of locations on the nano-engineered material.

33. The method of claim 31, wherein translation of the laser source produces a one-dimensional line scan of locations on the nano-engineered material.

34. A method of measuring thermal properties of a nano-engineered material, comprising:
irradiating a nano-engineered material with laser radiation, wherein the laser radiation impinges on a first surface of the nano-engineered material at one or more locations;
capturing at least one image of the nano-engineered material using an infrared camera, wherein the at least one image of the nano-engineered material is captured from a second surface of the nano-engineered material; and
analyzing the at least one image to characterize the thermal properties of the nano-engineered material.

35. The method of claim 34, wherein the at least one image is a sequence of images.

36. The method of claim 34, wherein the laser radiation is ultraviolet radiation.

37. The method of claim 34, wherein the irradiating step comprises generating laser pulses in a sequential manner utilizing at least one laser source and optical beam splitters.

38. The method of claim 34, wherein the irradiating step comprises generating laser pulses in a simultaneous manner utilizing one or more laser sources.

39. The method of claim 34, wherein the irradiating step comprises translation of the nano-engineered material with respect to a laser source as a function of time.

40. The method of claim 34, wherein the irradiating step comprises translation of a laser source with respect to the nano-engineered material as a function of time.

41. The method of claim 40, wherein translation of the laser source produces a two-dimensional raster scan of locations on the nano-engineered material.

42. The method of claim 40, wherein translation of the laser source produces a one-dimensional line scan of locations on the nano-engineered material.

* * * * *